United States Patent [19]

Tsunehiro et al.

[11] Patent Number: 5,335,263
[45] Date of Patent: Aug. 2, 1994

[54] POWER SUPPLY SWITCHING CIRCUIT FOR A COMPACT PORTABLE TELEPHONE SET

[75] Inventors: Naoshi Tsunehiro, Tokyo; Akihiko Sekiguchi; Asako Nakamura, both of Yokohama, all of Japan

[73] Assignee: Matsushita Electric Industrial Co., Ltd., Osaka, Japan

[21] Appl. No.: 909,713

[22] Filed: Jul. 7, 1992

[30] Foreign Application Priority Data

Jul. 18, 1991 [JP] Japan ................................. 3-178133

[51] Int. Cl.$^5$ .................................................. H04M 11/00
[52] U.S. Cl. ...................................... 379/58; 455/343
[58] Field of Search ............... 379/56, 61, 58; 455/73, 455/127, 343, 89, 346

[56] References Cited

U.S. PATENT DOCUMENTS

| 4,511,761 | 4/1985 | Yamazaki et al. |
| 4,647,722 | 3/1987 | Nishida et al. |
| 4,852,147 | 7/1989 | Suzuki et al. |
| 5,170,491 | 12/1992 | Murata ................. 455/73 |

FOREIGN PATENT DOCUMENTS

| 0115966 | 8/1984 | European Pat. Off. |
| 0326413 | 8/1989 | European Pat. Off. |
| 567377 | 2/1981 | Japan . |

OTHER PUBLICATIONS

Schilling, et al, "Electronic Circuits, Discrete and Integrated", 1979, pp. 139-145, 161, 162, 166, and 167.
"Battery Switching Circuit for Dual-Battery Systems," IBM Technical Disclosure Bulletin, vol. 31, No. 12, May, 1989.
"Power Supply Isolator for RAM Back-Up Battery," IBM Technical Disclosure Bulletin, vol. 26, No. 6, Nov. 1983.

Primary Examiner—Curtis Kuntz
Assistant Examiner—William Cumming
Attorney, Agent, or Firm—Stevens, Davis, Miller & Mosher

[57] ABSTRACT

In order to reduce volume and weight of a power supply of a compact portable telephone set and thus reduce volume and weight of the compact portable telephone set itself, a P-channel power MOSFET is used as a power switching element, and a negative voltage, for example, −11 volts is applied across a source and a gate from a DC/DC converter to turn on the P-channel power MOSFET so that power is supplied from a battery 2 which serves as one power supply. When the gate and the source of the power MOSFET are maintained at the same potential, the power MOSFET is turned off and power is supplied from another power supply.

14 Claims, 3 Drawing Sheets

POWER SUPPLY SWITCHING CIRCUIT FOR A COMPACT PORTABLE TELEPHONE SET

BACKGROUND OF THE INVENTION

The present invention relates to a power supply switching circuit for a portable telephone set or an automobile portable telephone set.

In portable telephone sets and automobile portable telephone sets (hereinafter collectively referred to as a compact portable telephone set), a power capacity of a battery (second power supply) is designed to be small in order to reduce weight, and when the telephone set is not carried, the power supply is switched to a fixed power supply (first power supply) to extend the life of the built-in battery, which serves as the power supply. In the prior art, a relay is used for switching the power supply.

FIG. 3 shows a prior art power supply switching circuit. A symbol a denotes a compact portable telephone set whose power supply is to be switched, numeral 1 denotes a relay for switching the power supply, numeral 2 denotes a battery such as NiH or NiCd built in the compact portable telephone set, and numeral 3 denotes a fixed power supply or other power supply. The power from the battery 2 and the other power supply 3 are selectively supplied to a control unit 5 and an RF unit 6 of the compact portable telephone set through contacts of the relay 1. Relay 1 has an exciting coil 1' thereof driven by a control current from a switching control circuit 4.

However, in the prior art power supply switching which uses a relay, the volume occupied by the relay shares a large portion of the total volume of the compact portable telephone set and this has been a barrier in reducing the volume and weight of the compact portable telephone set.

SUMMARY OF THE INVENTION

In light of the above, it is an object of the present invention to provide a power supply switching circuit for a compact portable telephone set which can satisfy the strong need to reduce the volume of compact portable telephone sets.

In the present invention, a single P-channel power MOSFET is used as a power supply switching element, and a negative voltage is applied across a gate and a source thereof through a switching control circuit. The switching control circuit controls the turn-on and turn-off of the power MOSFET to reduce a resistance between a drain and the source of the MOSFET so that one power supply is connected to the compact portable telephone set through the drain-source path. When the gate and the source of the MOSFET are kept at the same potential through the switching control circuit, the other power supply is connected to the compact portable telephone set.

In accordance with the present invention, the built-in battery and the other power supply are electronically switched by merely applying negative voltage across the gate and the source of a single P-channel power MOSFET. Thus, the occupancy volume is naturally small and a voltage drop in the power supply switching is as low as 0.2 Ω at a load current of 1 ampere. Accordingly, the need to reduce the volume and weight of the compact portable wireless equipment can be fully satisfied.

DESCRIPTION OF THE PREFERRED EMBODIMENTS

One embodiment of the present invention is now explained with reference to the drawings.

Figure 1:
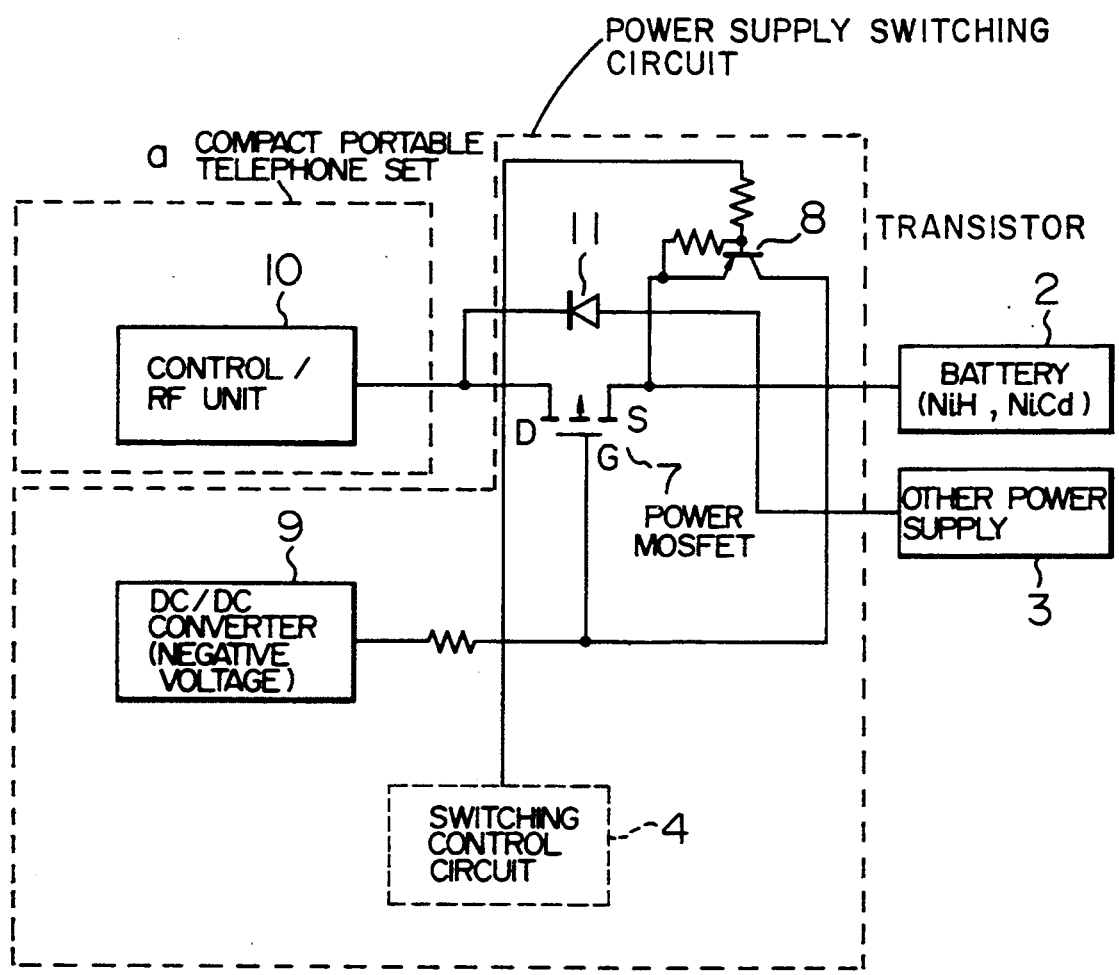
FIG. 1 shows a configuration of a power supply switching circuit for a compact portable telephone set in one embodiment of the present invention.
Figure 3:
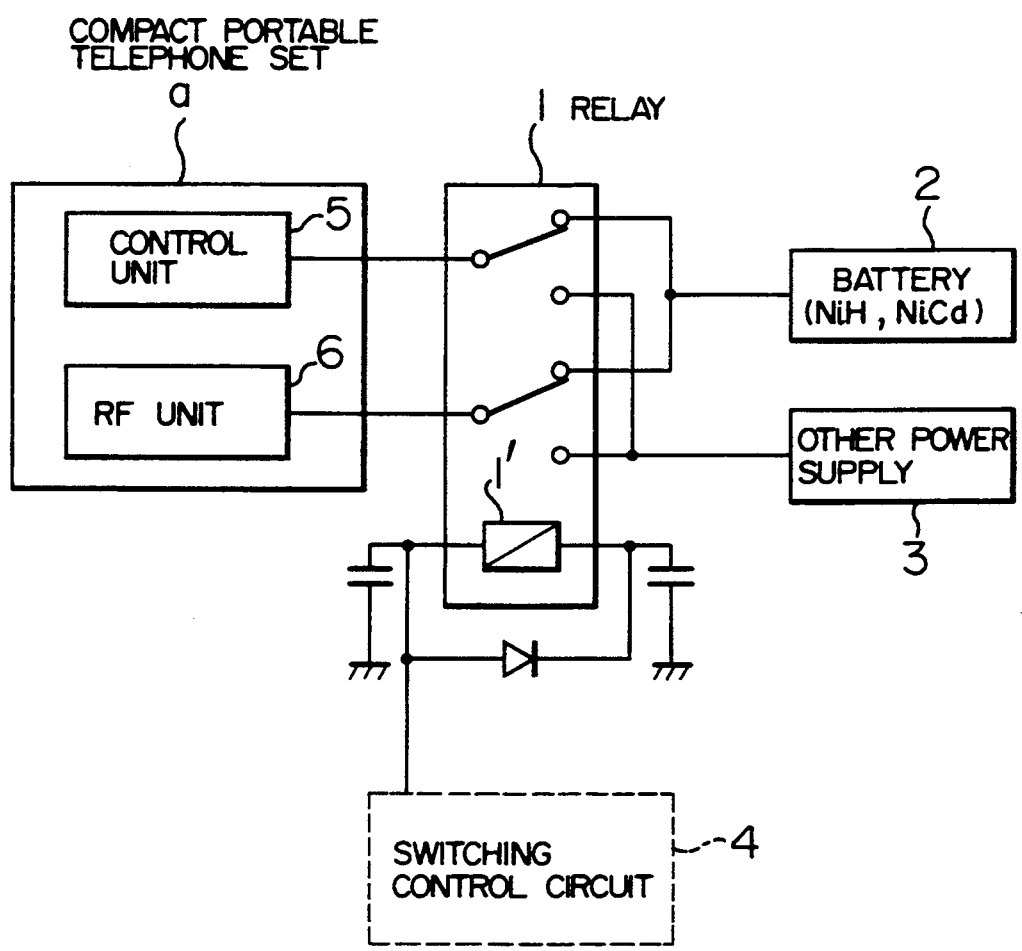
FIG. 3 shows a configuration of a prior art power supply switching circuit for the compact portable telephone set.

FIG. 1 shows a configuration of a power supply switching circuit in one embodiment of the present invention. Numeral 7 denotes a P-channel power MOSFET which is a feature of the present invention, numeral 8 denotes a transistor for driving the power MOSFET 7, numeral 9 denotes a DC/DC converter and numeral 10 denotes a control unit and RF unit which are parts of a compact portable telephone set a. Other numerals are the same as those of FIG. 3.

In the present circuit, when a negative control voltage is applied from the switching control circuit 4, the transistor 8 is turned on so that a negative voltage supplied from the DC/DC converter 9 appears at a source S of the P-channel power MOSFET 7. On the other hand, the negative voltage from the DC/DC converter 9 is applied to a gate G of the P-channel power MOSFET 7. Accordingly, the gate G and the source S are at the same potential and the gate-source path of the P-channel power MOSFET is cut off. Therefore, the power is supplied to the compact portable telephone set a from the other power supply 3 through the diode 11.

When a positive voltage is applied from the switching control circuit 4 or the application of the negative voltage is terminated, the transistor 8 is turned off so that the negative voltage from the DC/DC converter 9 does not appear at the source S of the P-channel power MOSFET 7 and only the gate G is negative. As a result, a resistance between the source S and the drain D of the P-channel power MOSFET 7 is very low and the compact portable telephone set a is powered from the battery 2.

Figure 2:
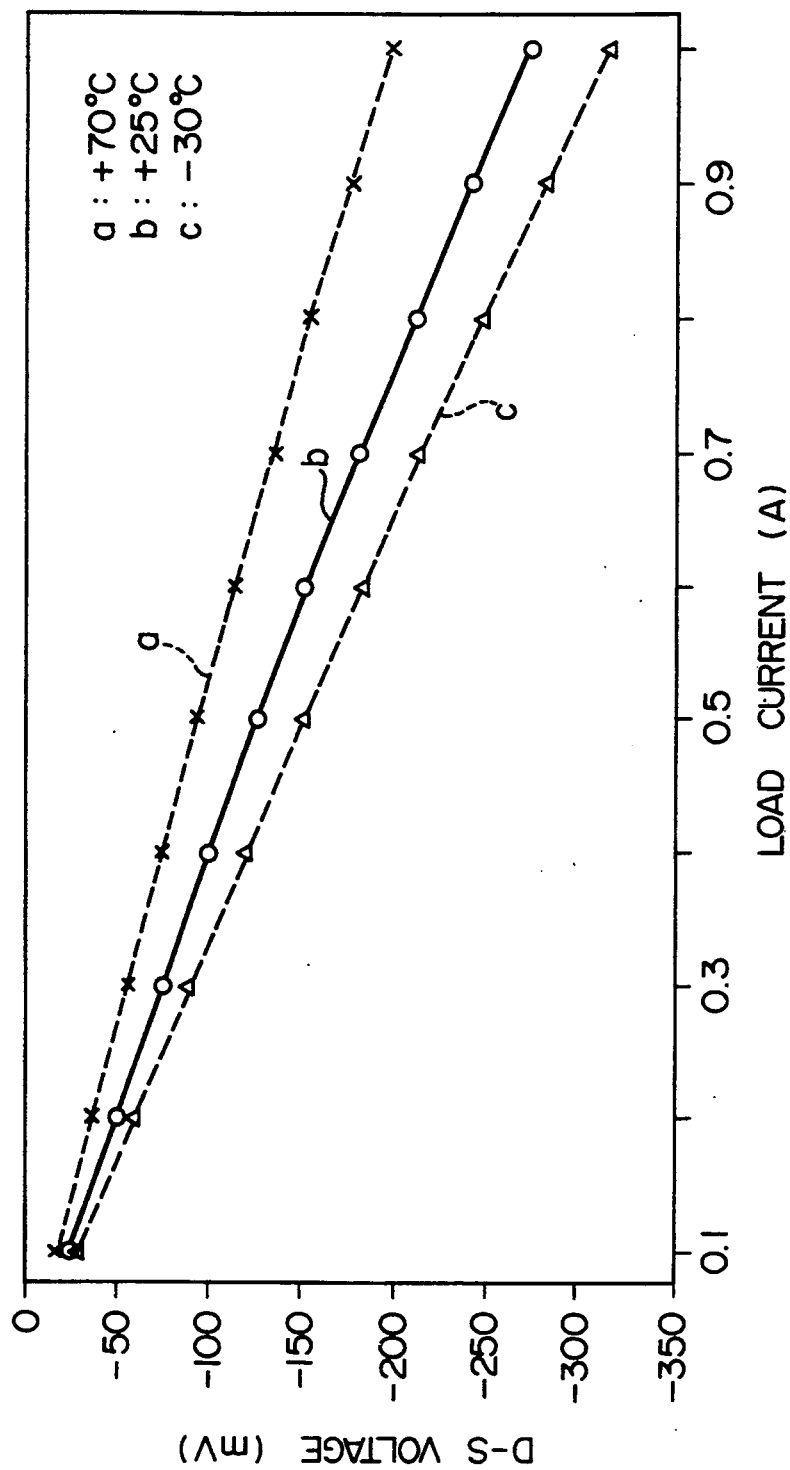
FIG. 2 shows a load current characteristic for a gate-source voltage in the configuration of FIG. 1.

FIG. 2 shows a load current characteristics attainable by the configuration of FIG. 1 for various environmental temperatures and drain-source voltages. As seen from the characteristic chart, a load current of 1 ampere is attained by a control voltage of approximately 200 mV across the source and the drain even under a severe condition of a temperature of +70° C. (characteristic curve a).

In FIG. 2, a characteristic curve b is for a temperature of +25° C., and a characteristic curve c is for a temperature of −30° C.

In the present invention, the power from the battery 2 and the other power supply 3 are selectively switched to the compact portable telephone set by utilizing the low resistance between the source and the drain of the power MOSFET.

The power supply switching circuit for the compact portable telephone set of the present invention utilizes the low resistance between the drain and the source of the P-channel power MOSFET. Since it uses a power MOSFET, the occupancy volume for switching is much smaller than that of the conventional mechanical relay and the weight thereof is naturally smaller. Accordingly, it has a wide application to the power supply switching of the compact portable telephone sets in allowing these to become more and more compacted.

What is claimed is:

1. A power supply switching system for a compact portable telephone set comprising:

a first power supply for supplying power to said compact portable telephone set;

a second power supply, having a smaller power capacity than said first power supply, for supplying power to said compact portable telephone set;

a power supply switching element for electrically correcting the compact portable telephone set and said second power supply, said switching element comprising a single P-channel power MOSFET having a gate, a drain and a source;

a separate path for connecting said first power supply and said compact portable telephone set; and switching control means for controlling switching of said power supply switching element;

said switching control means including a switching control circuit and negative voltage generation means for (i) turning-on said P-channel power MOSFET by applying a negative voltage across the gate and the source of said P-channel power MOSFET when said second power supply is to be connected to the compact portable telephone set so as to reduce resistance between the drain and the source of said P-channel power MOSFET, and (ii) turning-off said P-channel power MOSFET by maintaining the gate and the source of said P-channel power MOSFET at a same potential when said first power supply is to be connected to said compact portable telephone set, wherein said compact portable telephone set is powered by said second power supply when said P-channel power MOSFET is turned-on and said compact portable telephone set is powered by said first power supply, via said separate path, when said P-channel power MOSFET is turned-off.

2. A power supply switching system for a compact portable telephone set according to claim 1, further comprising a transistor circuit for driving said power MOSFET.

3. A power supply switching system for a compact portable telephone set according to claim 1, wherein said separate path includes a diode between said first power supply and said compact portable telephone set.

4. A power supply switching system for a compact portable telephone set according to claim 1, wherein said first power supply comprises a fixed power source and said second power supply comprises a battery.

5. A power supply switching system for a compact portable telephone set according to claim 2, wherein said first power supply comprises a fixed power source and said second power supply comprises a battery.

6. A power supply switching system for a compact portable telephone set according to claim 3, wherein said first power supply comprises a fixed power source and said second power supply comprises a battery.

7. A power supply switching system for a compact portable telephone set according to claim 2, wherein said separate path includes a diode between said first power supply and said compact portable telephone set.

8. A power supply switching system for a compact portable telephone set according to claim 7, wherein said first power supply comprises a fixed power source and said second power supply comprises a battery.

9. A power supply switching system for a compact portable telephone set according to claim 1, wherein said negative voltage generating means comprises a DC/DC converter.

10. A power supply switching system for a compact portable telephone set according to claim 2, wherein said negative voltage generating means comprises a DC/DC converter.

11. A power supply switching system for a compact portable telephone set according to claim 3, wherein said negative voltage generating means comprises a DC/DC converter.

12. A power supply switching system for a compact portable telephone set according to claim 4, wherein said negative voltage generating means comprises a DC/DC converter.

13. A power supply switching system for a compact portable telephone set according to claim 5, wherein said negative voltage generating means comprises a DC/DC converter.

14. A power supply switching system for a compact portable telephone set according to claim 6, wherein said negative voltage generating means comprises a DC/DC converter.

* * * * *